United States Patent
Su (10) Patent No.: US 7,494,890 B2
(45) Date of Patent: Feb. 24, 2009

(54) TRENCH CAPACITOR AND METHOD FOR MANUFACTURING THE SAME

(75) Inventor: Yi-Nan Su, Tao-Yuan (TW)

(73) Assignee: United Microelectronics Corp., Hsin-Chu (TW)

( * ) Notice: Subject to any disclaimer, the term of this patent is extended or adjusted under 35 U.S.C. 154(b) by 454 days.

(21) Appl. No.: 11/162,489

(22) Filed: Sep. 12, 2005

(65) Prior Publication Data

US 2007/0054461 A1 Mar. 8, 2007

(51) Int. Cl.
*H01L 21/20* (2006.01)
(52) U.S. Cl. ............ 438/386; 257/301; 257/E21.396
(58) Field of Classification Search ............ 438/248, 438/391, 243, 386; 257/301, E27.092, E29.346, 257/E21.396
See application file for complete search history.

(56) References Cited

U.S. PATENT DOCUMENTS

| 6,420,226 B1* | 7/2002 | Chen et al. | 438/238 |
| 6,750,499 B2* | 6/2004 | Wu | 257/305 |
| 7,193,262 B2* | 3/2007 | Ho et al. | 257/304 |
| 2006/0008976 A1* | 1/2006 | Tu | 438/238 |

\* cited by examiner

*Primary Examiner*—Asok K Sarkar
(74) *Attorney, Agent, or Firm*—Winston Hsu (57) ABSTRACT

A structure of a trench capacitor and method for manufacturing the same. The method includes providing a substrate having a defined memory area and logic area, and performing an STI process to form at least one STI region on the memory area of the substrate and at least one STI region on the logic area of the substrate. Then, a patterned mask is formed on the substrate and the STI region to partially expose the STI region and partially expose the substrate surrounding the STI region. Next, the STI region and the substrate not covered by the mask are etched to from a plurality of deep trench.

13 Claims, 9 Drawing Sheets

TRENCH CAPACITOR AND METHOD FOR MANUFACTURING THE SAME

BACKGROUND OF THE INVENTION

1. Field of the Invention

The invention relates to a structure of a trench capacitor and method for manufacturing the same, and more particularly, to a method of manufacturing a trench capacitor in which the STI process is compatible with the logic processes, and in which the capacitor area is effectively increased.

2. Description of the Prior Art

As electrical products tend towards increasing miniaturization, DRAM devices need to have a high integration and density. Trench capacitor DRAM devices are popularly used for high density DRAM that is formed in a deep trench capacitor of the semiconductor substrate to effectively decrease the size of memory unit and efficiently utilize the space of the chip.

Figure 1:
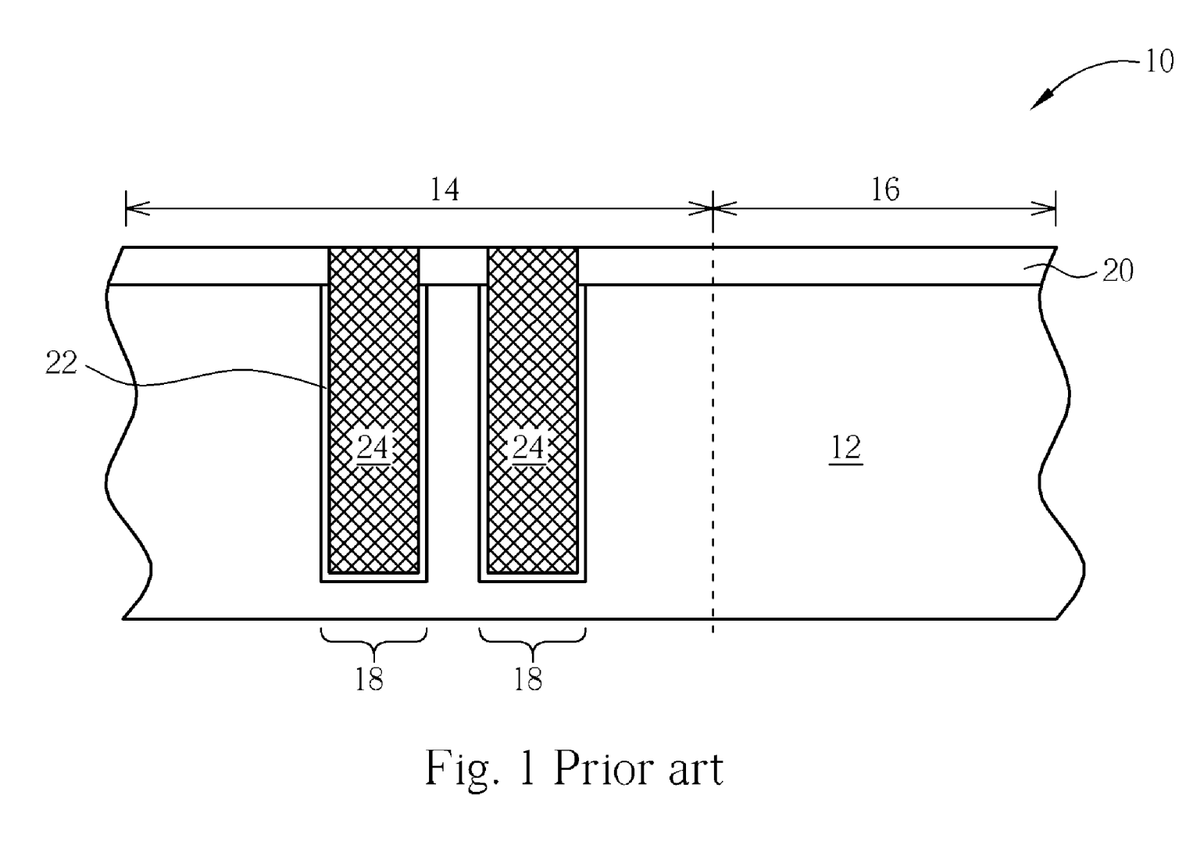
FIG. 1 to FIG. 4 are schematic cross-sectional views showing the fabrication of STI regions between trench capacitors according to the prior art.

Please refer to FIG. 1 to FIG. 4, which are schematic cross-sectional views showing the fabrication of Shallow Trench Isolation (STI) regions between trench capacitors according to a prior art method. As shown in FIG. 1, a semiconductor chip 10 comprises a logic area 16 and a memory array area 14. As indicated, a plurality of trench capacitors 18 has been formed in the semiconductor substrate 12 within the memory array area 14 of the semiconductor chip 10. Typically, each of the trench capacitors 18 is formed by etching a hard mask 20 to form a deep trench opening (not shown) in the silicon substrate 12, and then an electrode of the capacitor (not shown), a poly storage node 24 serving as the other electrode of the capacitor, and a node dielectric layer 22 between the two electrodes are formed in the deep trench opening.

Figure 2:
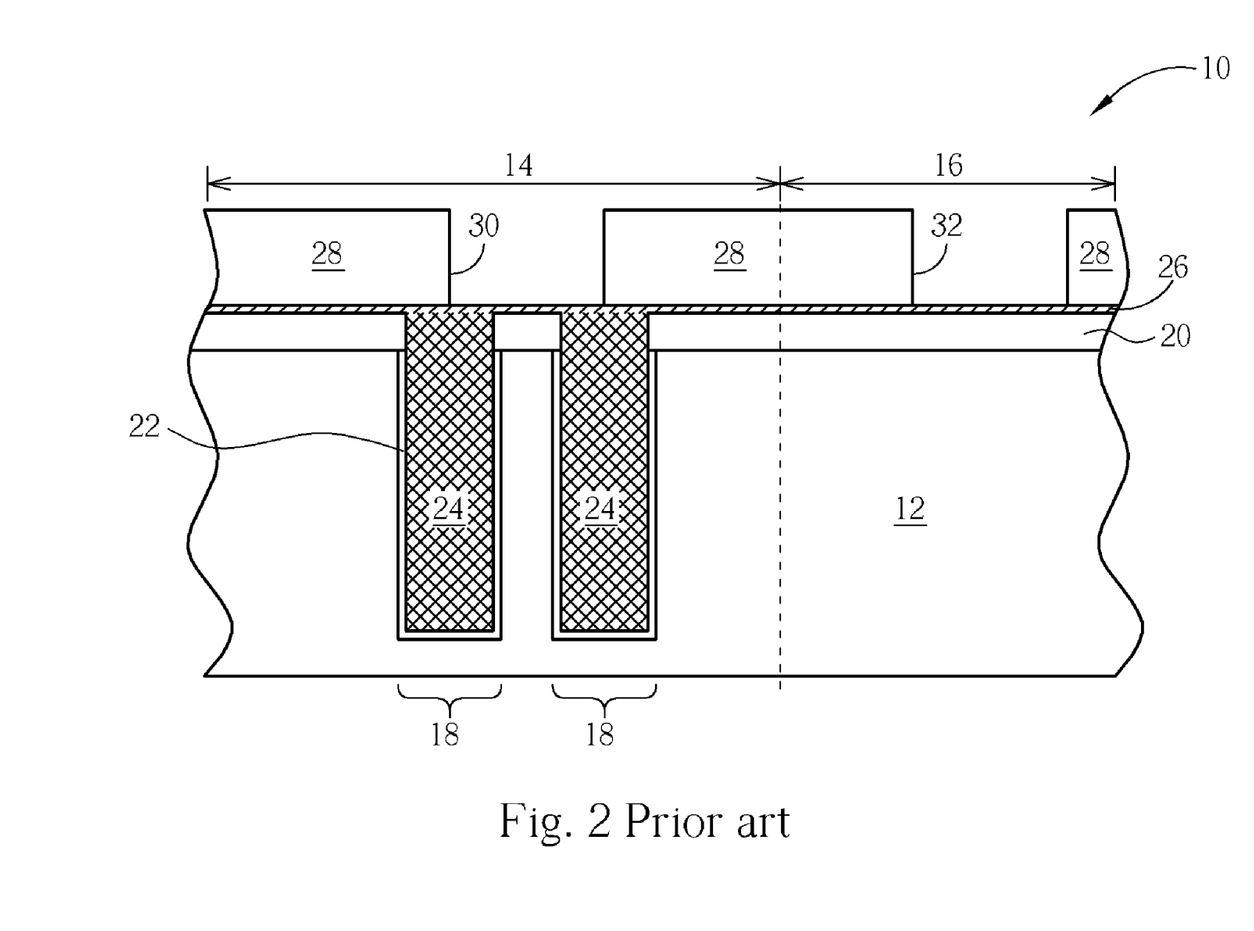

As shown in FIG. 2, a bottom anti-reflection coating (BARC) 26 is deposited on the mask 20, followed by photoresist coating. A conventional lithographic process and subsequent baking process are then carried out to pattern the photoresist coating, thereby forming photo mask 28 defining the trench openings 30 of the memory array 14 and the trench openings 32 of the logic area.

Figure 3:
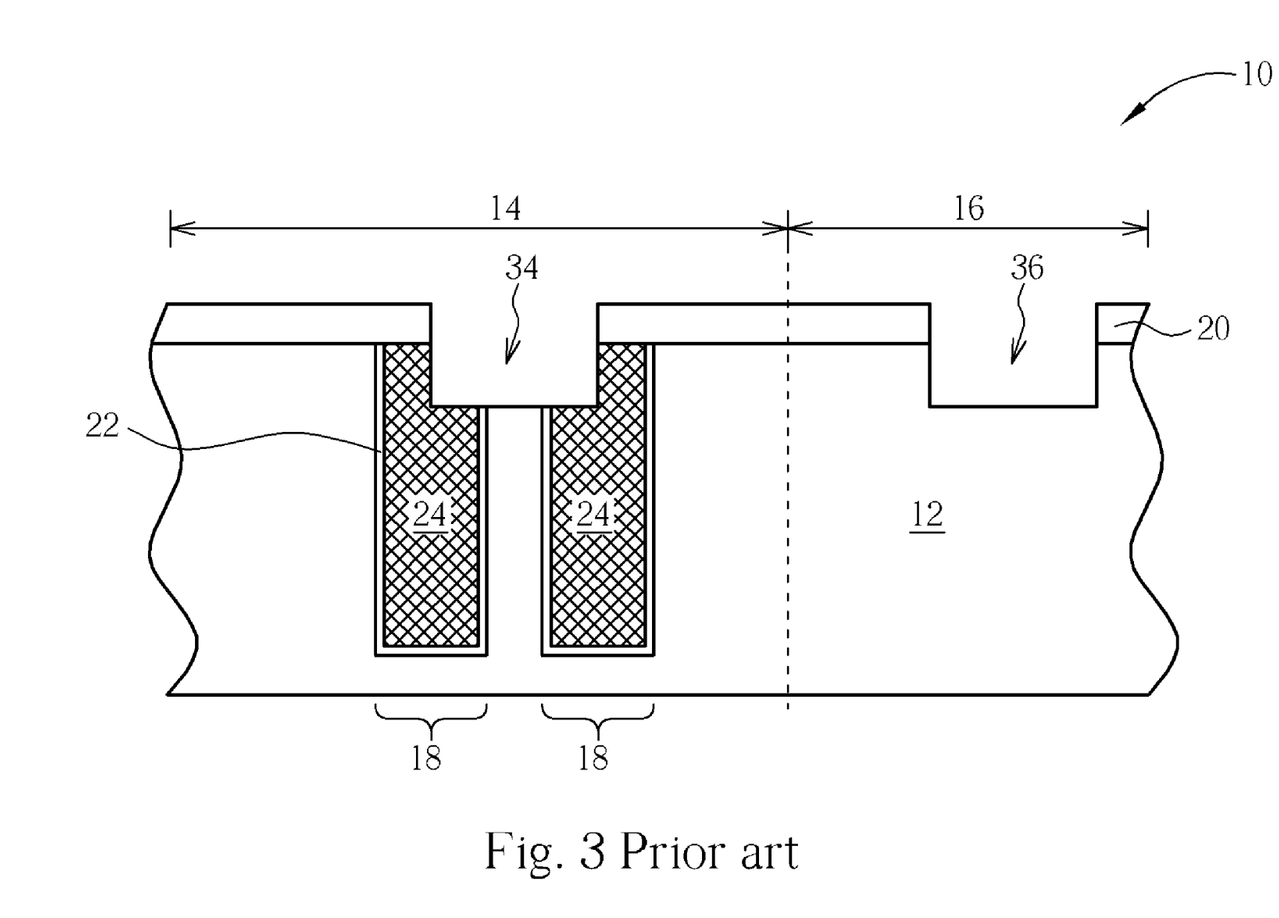
Figure 4:
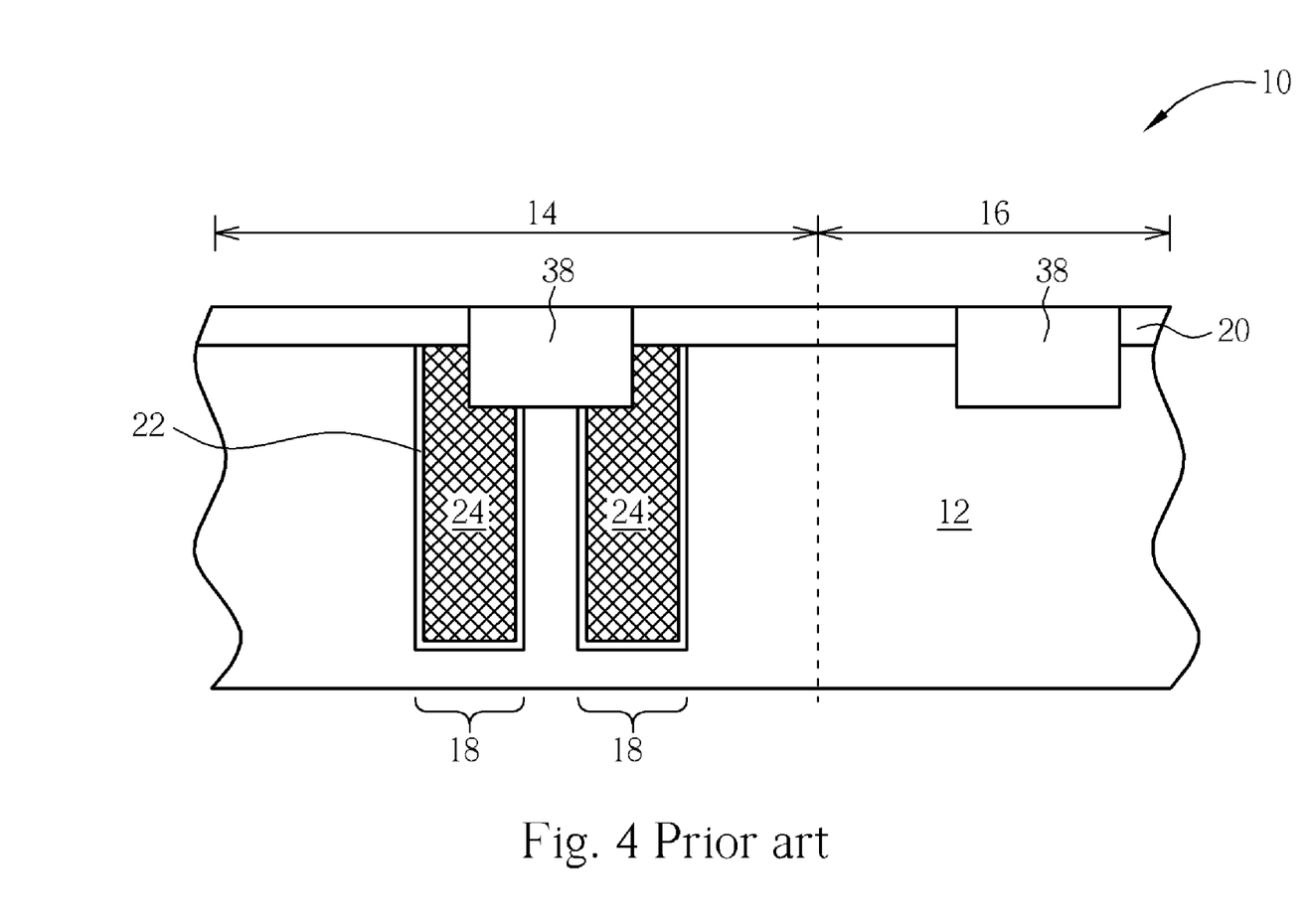

As shown in FIG. 3, using the photo mask 28 as an etching mask, a plasma dry etching is performed to etch the BARC 26, the hard mask 20, the silicon substrate 12, and a portion of the storage node 24 and node dielectric layer 22 through the memory array area trench openings 30 within the memory array area 14, thereby forming isolation trenches 34. The BARC 26, the hard mask 20, and substrate 12 are also etched through the logic area trench openings 32 within the logic area 16, thereby forming isolation trenches 36. Thereafter, the remaining photo mask 28 and the BARC 26 are removed. Finally, as shown in FIG. 4, the isolation trenches 34 and 36 are filled with gap fill dielectric materials 38 and planarized.

However, there are several problems with the above-described prior art STI method of forming trench capacitor DRAM devices. Because trench capacitors 18 are complex, the STI etching process is complex and is not easy to control the STI region 34 formed by etching the BARC 24, the hard mask 20, the silicon substrate 12, the portion of storage node 24, and node dielectric layer 22 through trench openings 30. First, the thick hard mask leads to bad critical dimension (CD) uniformity and large iso/dense CD bias. Secondly, the STI trench recipe is difficult to develop because of the complex structure of the trench capacitor. Thirdly, the above-described prior art STI method for trench capacitor DRAM devices is not compatible with the logic processes.

SUMMARY OF THE INVENTION

It is therefore a primary objective of the claimed invention to provide a trench capacitor and method of manufacturing the same to solve the above-mentioned problem.

According to the claimed invention, a method of manufacturing a trench capacitor is provided. The method includes the following steps:

providing a substrate having a defined memory array area and logic area;

performing an STI process, at least one STI region formed within the substrate in each of the memory array and the logic areas;

forming a patterned mask on the substrate and the STI region, the mask partially exposing the STI region and partially exposing the substrate in peripheral regions of the STI region in the memory array areas; and etching the substrate and the STI region of the memory array area not covered by the mask to form a plurality of deep trenches.

According to the claimed invention, another method of manufacturing a trench capacitor is provided. The method includes the following steps:

providing a substrate having a defined memory array area and logic area;

depositing sequentially an oxide layer and a silicon nitride layer on the substrate;

performing an STI process, at least one STI region formed within the oxide layer, the silicon nitride layer, and the substrate within each of the memory array and the logic areas;

forming a patterned mask on the silicon nitride layer and the STI region, the mask partially exposing the silicon nitride layer and partially exposing the STI region in the memory array area;

etching the silicon nitride layer and the the STI region in the memory array area not covered by the mask to from a plurality of deep trenches, each deep trench having a vertical sidewall in contact with the STI region, and a curve sidewall not in contact with the STI region.

According to the claimed invention, a trench capacitor is provided. The trench capacitor includes:

a substrate;

an STI region disposed in the substrate;

a plurality of deep trenches formed adjacent to the STI region in the substrate, each deep trench having a vertical sidewall in contact with the STI region, a curve sidewall not in contact with the STI region, and the curve sidewall is capable of increasing effective capacitor area; and a plurality of capacitor structures respectively positioned in each deep trench.

It is an advantage of the claimed invention that the STI is fabricated before the trench capacitor so that the present invention has better critical dimension (CD) uniformity and less iso/dense CD bias, and provides an STI process that is compatible with logic processes to enhance quality and decrease the cost.

These and other objectives of the present invention will no doubt become obvious to those of ordinary skill in the art after reading the following detailed description of the preferred embodiment that is illustrated in the various figures and drawings.

DETAILED DESCRIPTION

Figure 5:
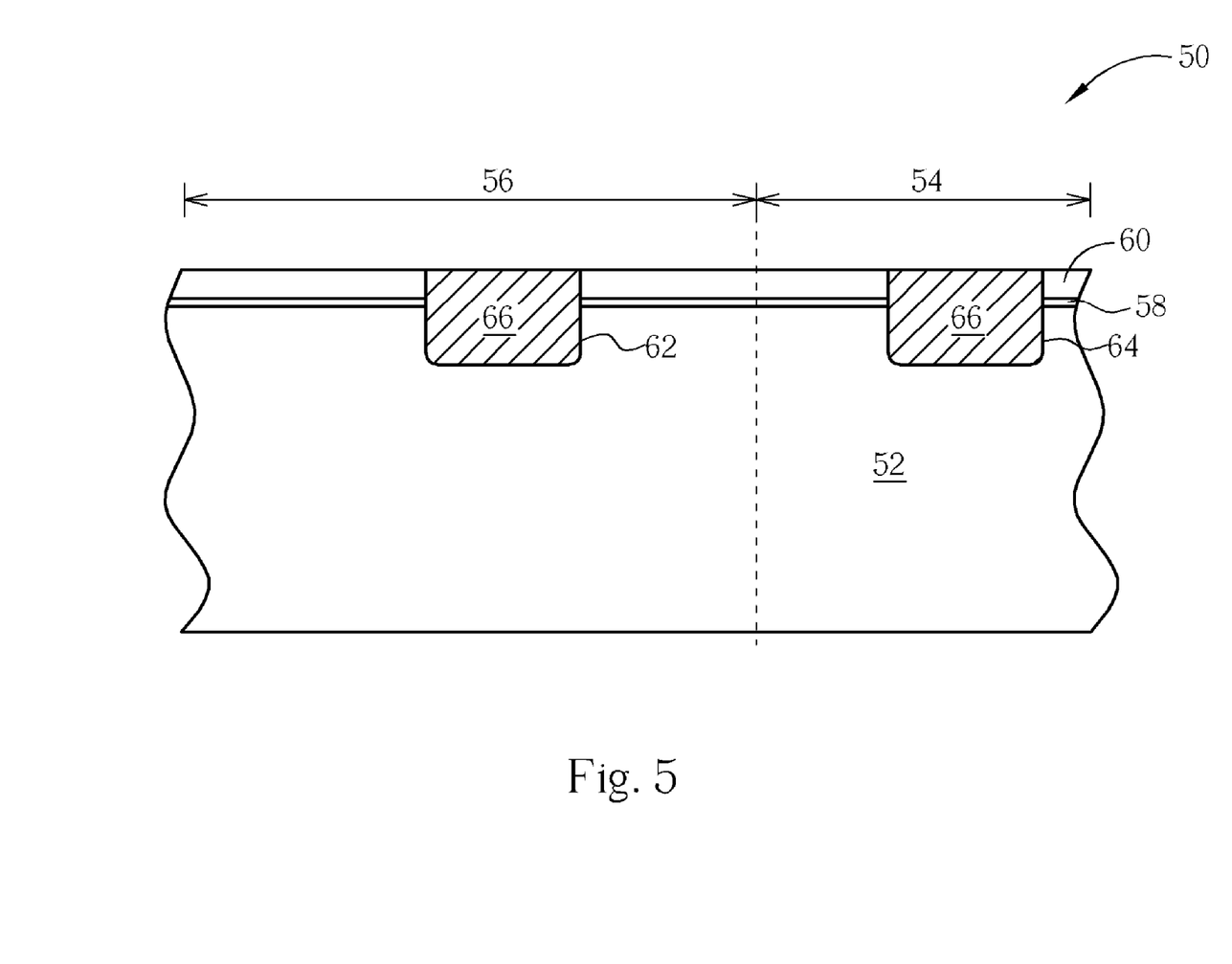
FIG. 5 to FIG. 8 are schematic diagrams of the method of manufacturing trench capacitor according to the present invention.

Please refer to FIG. 5 to FIG. 8 that are schematic diagrams of the method of manufacturing trench capacitor according to the present invention. As shown in FIG. 5, the present invention provides a semiconductor chip 50 having a defined logic area 54 and memory array area 56. A plurality of STI regions 62 is formed in the substrate 52 of the memory array area 56 and a plurality of STI regions 64 is formed in the substrate 52 of the logic area 54. The STI regions 62, 64 are formed in the substrate 52 (such as silicon substrate), an oxide layer 58, and a silicon nitride layer 60 by a mask (not shown), and then the STI regions 62, 64 are formed by filling with insulating materials e.g. silicon oxide and planarizing.

Figure 6:
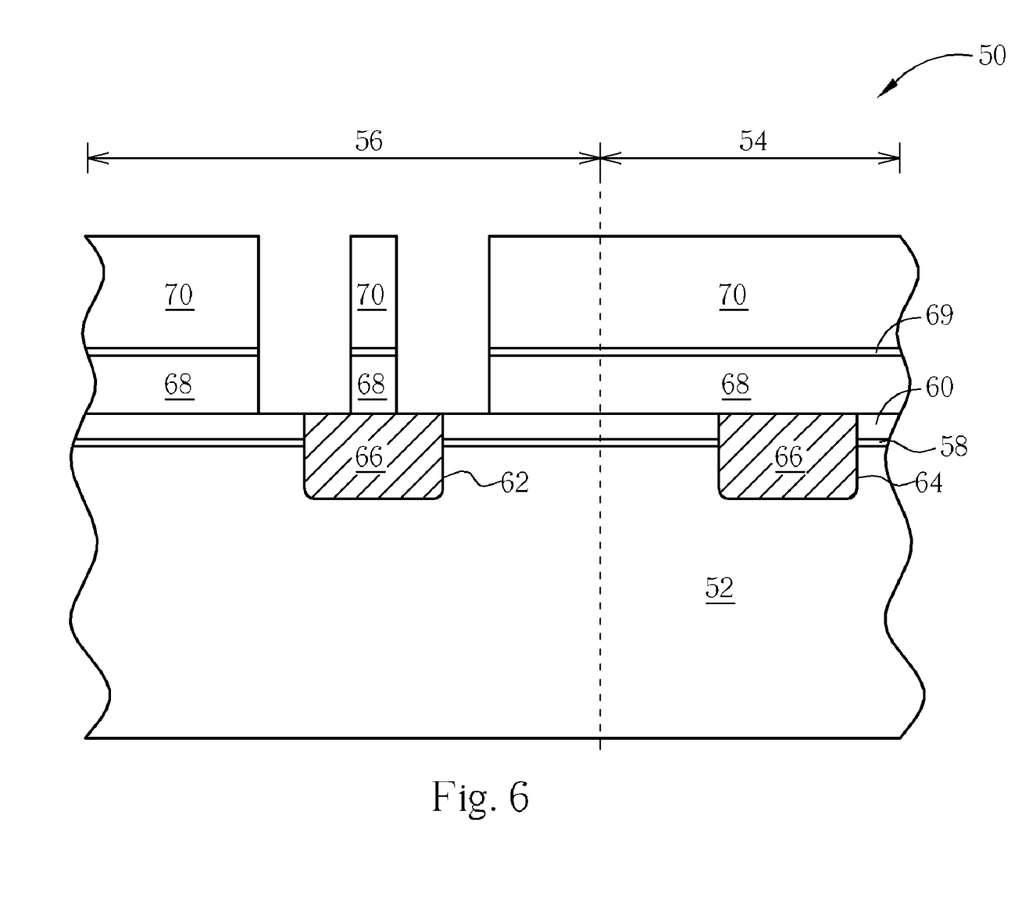

As shown FIG. 6, a patterned mask, such as a photoresist layer 70, is formed on the silicon nitride layer 60 and STI regions 62, 64. In addition, the present invention may further form a hard mask 68, and selectively form a bottom anti-reflection layer (BARC) 69 or/and other material layers between the photoresist layer 70 and the silicon nitride layer 60 to form a patterned composite material mask layer for defining a plurality of deep trenches on. The material of the hard mask 68 can be dielectric material, silicon dioxide, silicon nitride, silicon-oxy-nitride, phosphorous silicate glass (PSG), boron phosphorous silicate glass (BPSG), silicate, or carbide. It is to be appreciated that the mask is not limited to the above-described teaching, and can be modified wherever necessary.

Figure 7:
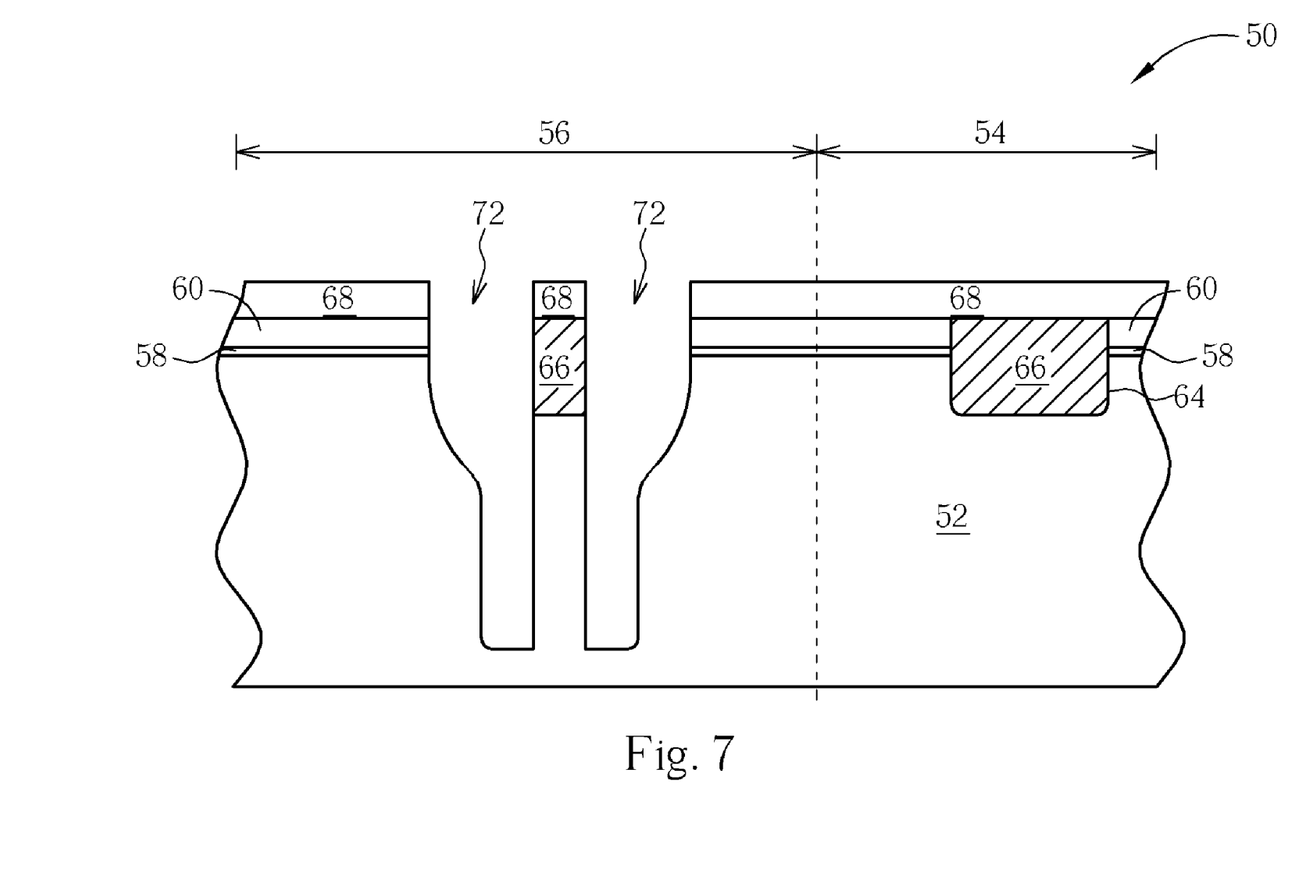

Next, as shown in FIG. 7, an etching process is performed to etch the STI region 62, the silicon nitride layer 60, the oxide layer 58, and the substrate 52 not covered by the photoresist layer 70 within the memory array area 56 and form a plurality of deep trench openings 72. It is appreciated that the deep trench openings 72 are formed after the STI region 62 is formed. Due to the different etching selectivity among the STI region 62, the substrate 52 and the silicon nitride layer 60, each deep trench opening 72 having a vertical sidewall in contact with the STI region 62, and a curve sidewall not in contact with the STI region 62. With the curve sidewall, the effective capacitor area is increased.

Figure 8:
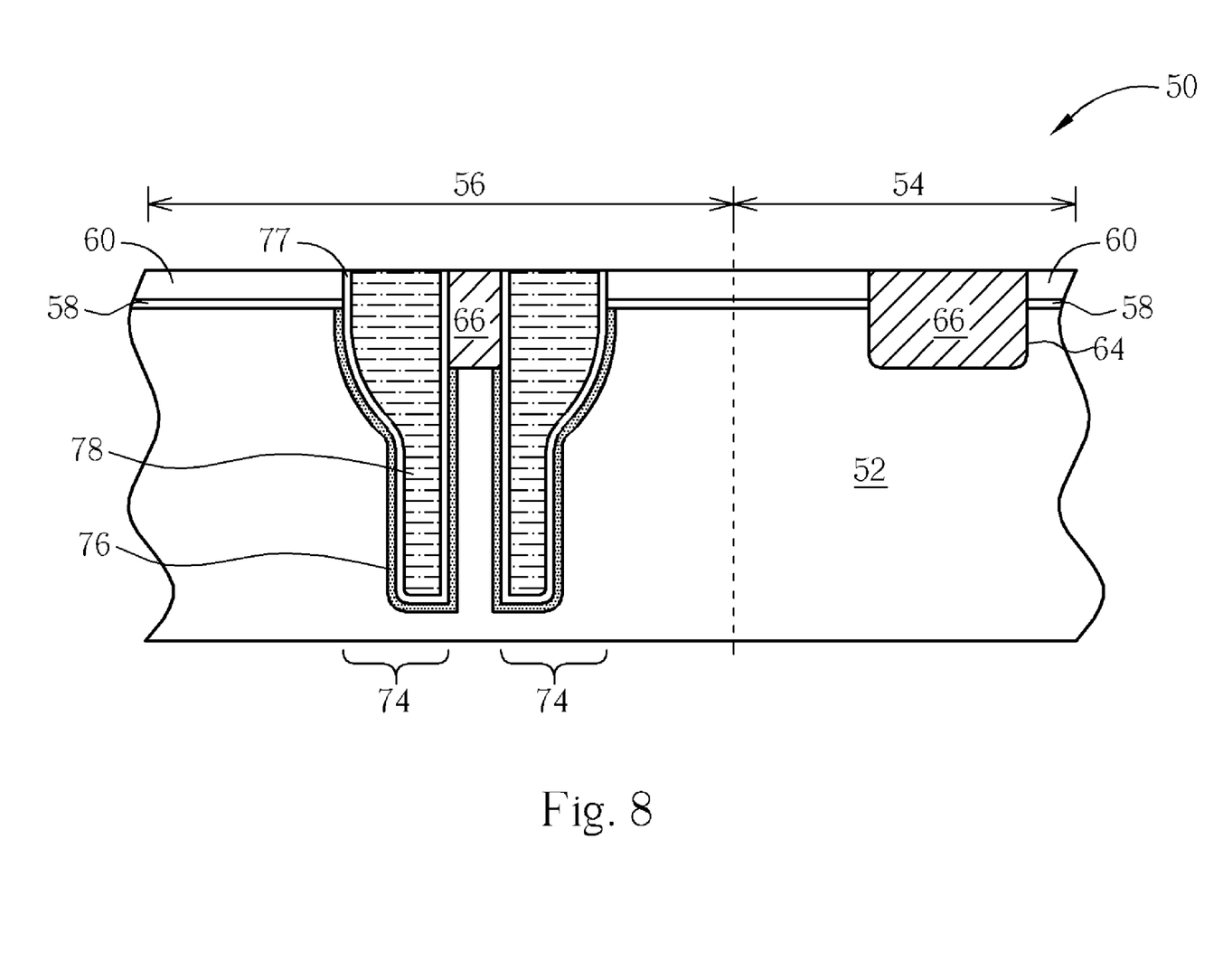

Finally, as shown FIG. 8, a plurality of trench capacitors 74 are formed in the deep trench openings 72 by the following steps. First, utilizing ASG diffusion technique, implantation process or tilt implantation process to form diffusion regions, which serve as capacitor bottom electrodes 76, in the sidewall and bottom of each deep trench opening 72. Then, a capacitor dielectric layer 77 is formed in each deep trench opening 72. Finally, a conductive material (not shown), such as polysilicon, is filled into the deep trench openings 72, and a CMP process is performed to polish the conductive material until the silicon nitride layer 60 used as a stop layer. Consequently, capacitor top electrodes 78 are formed in the deep trench openings 72. In this embodiment, the capacitor dielectric layer is an oxide/nitride/oxide layer, however, other single layer material or composite material can also be adopted.

Figure 9:
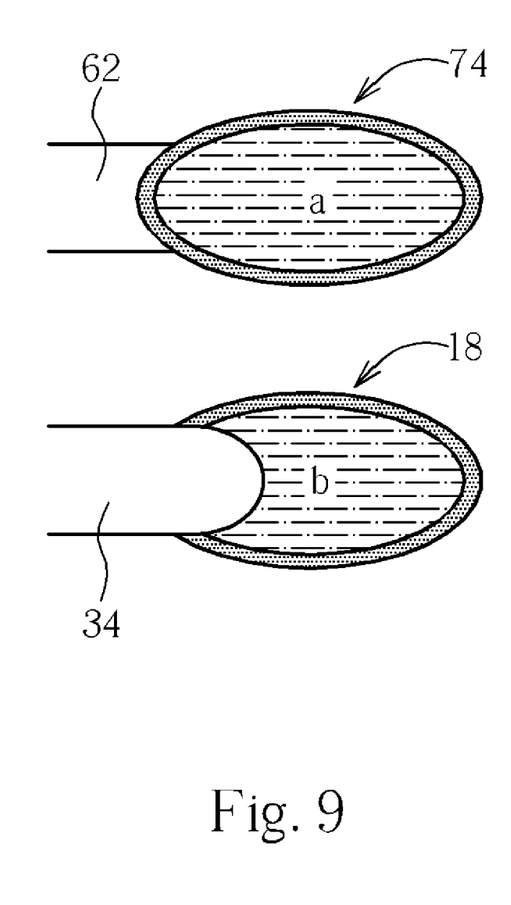
FIG. 9 is schematic diagram comparing the effective capacitor areas of the present invention and prior art.

Please now refer to FIG. 9, which is a schematic diagram comparison of the effective capacitor areas of the present invention and the prior art. According to the prior art, the STI region 34 is formed after the trench capacitor 18, so the STI region 34 covers a portion of the trench capacitor 18 resulting in the effective area "B" being decreased. On the other hand, the present invention's STI regions 62 and 64 of the memory array area 56 and logic area 54 are formed before the trench capacitor 74 of the memory array area 56 so the STI region 62 does not cover the trench capacitor 74, resulting in the effective area "A" being increased.

In conclusion, the present invention method of manufacturing a trench capacitor by forming the STI regions in the memory array and logic areas before fabricating the trench capacitor, when compared with the prior art, encompasses at least the following advantages.

1. The method of manufacturing a trench capacitor by forming the STI regions in the memory array area and logic area before fabricating the trench capacitor provides the benefit that the STI region(s) of the logic area are not influenced by later processing of the memory area so as to keep a better profile of STI in the logic area.

2. The present inventive method of manufacturing a trench capacitor can prevent bad CD uniformity and large iso/dense CD bias caused by performing the prior art's STI processes in the memory array area and logic area because in the prior art's STI processes, each different materials, such as a polymer/oxide layer/silicon nitride layer, has a different etching rate. The present invention improves the trench capacitor's compatibility with the logic processes so as to enhance the quality and decrease cost.

3. The method of manufacturing a trench capacitor by forming the STI regions in the memory array area and logic area before fabricating the trench capacitor enhances the effective capacitor area about 5%~15% because the STI regions do not cover the trench capacitor.

Those skilled in the art will readily observe that numerous modifications and alterations of the method may be made while retaining the teachings of the invention. Accordingly, the above disclosure should be construed as limited only by the metes and bounds of the appended claims.

What is claimed is:

1. A method of manufacturing a trench capacitor, the method comprising:
providing a substrate having a defined memory array area and logic area;
performing an STI process, at least one STI region formed within the substrate in each of the memory array and the logic areas;
forming a patterned mask on the substrate and the STI region, the mask partially exposing the STI region and partially exposing the substrate in peripheral regions of the STI region in the memory array areas; and
etching the substrate and the STI region of the memory array area not covered by the mask to form a plurality of deep trenches.

2. The method of claim 1 further comprising forming an oxide layer and a silicon nitride layer on the substrate prior to forming the STI region.

3. The method of claim 1 wherein the mask comprises a photoresist layer.

4. The method of claim 1 wherein the mask comprises a hard mask, a BARC deposited on the hard mask, and a photoresist layer deposited on the BARC.

5. The method of claim 4 wherein the material of the hard mask is selected from the group consisting of dielectric material, silicon dioxide, silicon nitride, silicon-oxy-nitride, phosphorous silicate glass (PSG), boron phosphorous silicate glass (BPSG), silicate, or carbide.

6. The method of claim 1 further comprising forming a capacitor bottom electrode, a capacitor dielectric layer, and a capacitor top electrode in each deep trench.

7. The method of claim 6 wherein the capacitor dielectric layer comprises an oxide/nitride/oxide layer.

8. A method of manufacturing trench capacitor, the method comprising:

providing a substrate having a defined memory array area and logic area;

depositing sequentially an oxide layer and a silicon nitride layer on the substrate;

performing an STI process, at least one STI region formed within the oxide layer, the silicon nitride layer, and the substrate within each of the memory array and the logic areas;

forming a patterned mask on the silicon nitride layer and the STI region, the mask partially exposing the silicon nitride layer and partially exposing the STI region in the memory array area; and etching the silicon nitride layer and the STI region in the memory array area not covered by the mask to from a plurality of deep trenches, each deep trench having a vertical sidewall in contact with the STI region, and a curve sidewall not in contact with the STI region.

9. The method of claim 8 wherein the mask comprises a photoresist layer.

10. The method of claim 9 further comprising forming a capacitor bottom electrode, a capacitor dielectric layer, and a capacitor top electrode in each deep trench.

11. The method of claim 10 wherein the capacitor dielectric layer comprises an oxide/nitride/oxide layer.

12. The method of claim 8 wherein the mask comprises a hard mask, a BARC deposited on the hard mask, and a photoresist layer deposited on the BARC.

13. The method of claim 12 wherein the material of the hard mask is selected from the group consisting of dielectric material, silicon dioxide, silicon nitride, silicon-oxy-nitride, phosphorous silicate glass (PSG), boron phosphorous silicate glass (BPSG), silicate, or carbide.

* * * * *